(12) United States Patent
Ong et al.

(10) Patent No.: US 10,985,147 B2
(45) Date of Patent: Apr. 20, 2021

(54) CAPACITORS EMBEDDED IN STIFFENERS FOR SMALL FORM-FACTOR AND METHODS OF ASSEMBLING SAME

(71) Applicant: Intel Corporation, Santa Clara, CA (US)

(72) Inventors: Jenny Shio Yin Ong, Bayan Lepas (MY); Seok Ling Lim, Kulim (MY); Bok Eng Cheah, Bukit Gambir (MY); Jackson Chung Peng Kong, Tanjung Tokong (MY); Chin Lee Kuan, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/017,719

(22) Filed: Jun. 25, 2018

(65) Prior Publication Data
US 2019/0006333 A1 Jan. 3, 2019

(30) Foreign Application Priority Data
Jun. 30, 2017 (MY) .......................... PI 2017702412

(51) Int. Cl.
| H01L 25/16 | (2006.01) |
| H01L 23/00 | (2006.01) |
| H01L 21/48 | (2006.01) |
| H01L 25/00 | (2006.01) |
| H01L 23/538 | (2006.01) |
| H01L 23/498 | (2006.01) |

(52) U.S. Cl.
CPC .......... *H01L 25/16* (2013.01); *H01L 21/4853* (2013.01); *H01L 23/562* (2013.01); *H01L 25/50* (2013.01); *H01L 23/49816* (2013.01); *H01L 23/5384* (2013.01); *H01L 23/5385* (2013.01); *H01L 23/5386* (2013.01); *H01L 24/16* (2013.01); *H01L 2224/16225* (2013.01); *H01L 2224/16227* (2013.01); *H01L 2924/00014* (2013.01); *H01L 2924/1304* (2013.01); *H01L 2924/1434* (2013.01); *H01L 2924/1436* (2013.01); *H01L 2924/15192* (2013.01); *H01L 2924/15311* (2013.01); *H01L 2924/19041* (2013.01); *H01L 2924/19105* (2013.01)

(58) Field of Classification Search
None
See application file for complete search history.

(56) References Cited

U.S. PATENT DOCUMENTS

| 7,898,093 | B1 * | 3/2011 | Darveaux | ............. | H01L 23/562 |
| | | | | | 257/787 |
| 10,651,127 | B2 * | 5/2020 | Kong | ....................... | H01L 25/16 |
| 2017/0365558 | A1 * | 12/2017 | Oh | ....................... | H01L 23/5389 |
| 2018/0286797 | A1 * | 10/2018 | Goh | ....................... | H01L 21/486 |

\* cited by examiner

*Primary Examiner* — Nicholas J Tobergte
*Assistant Examiner* — Kien C Ly
(74) *Attorney, Agent, or Firm* — Schwegman Lundberg & Woessner, P.A.

(57) ABSTRACT

A stiffener on a semiconductor package substrate includes a plurality of parts that are electrically coupled to the semiconductor package substrate on a die side. Both stiffener parts are electrically contacted through a passive device that is soldered between the two stiffener parts and by an electrically conductive adhesive that bonds a given stiffener part to the semiconductor package substrate. The passive device is embedded between two stiffener parts to create a smaller X-Y footprint as well as a lower Z-direction profile.

15 Claims, 8 Drawing Sheets

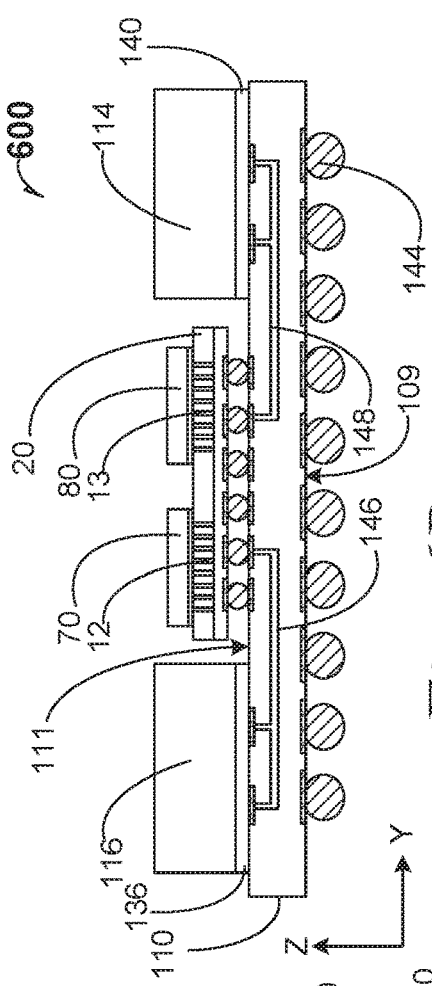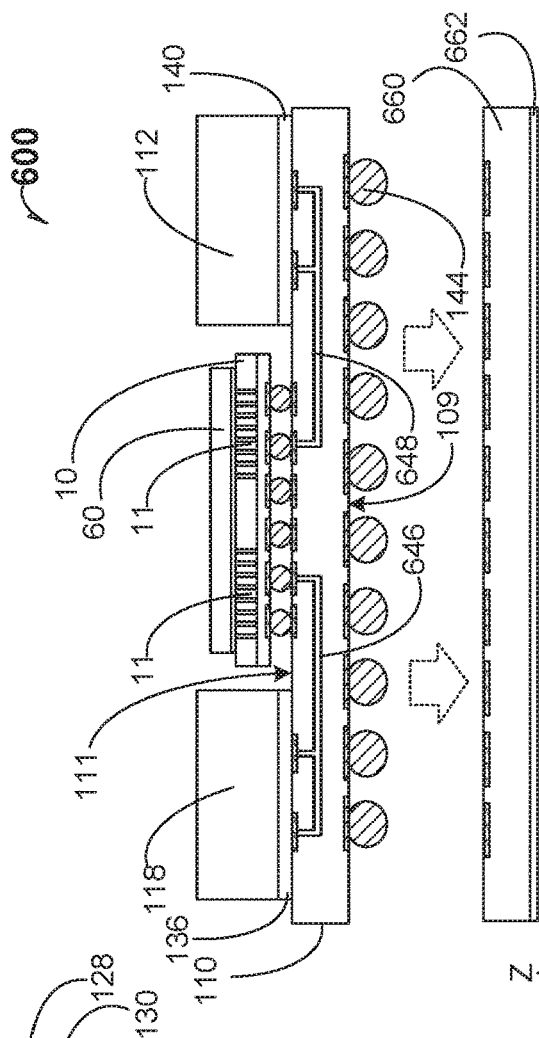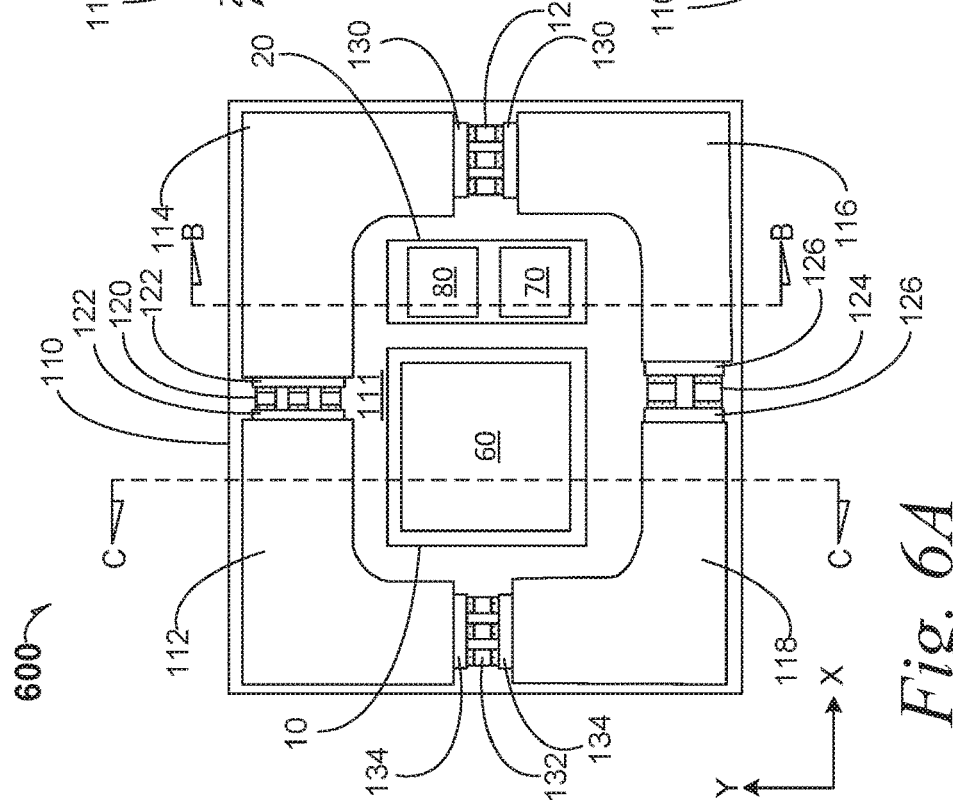
Fig. 6A
Fig. 6B
Fig. 6C

CAPACITORS EMBEDDED IN STIFFENERS FOR SMALL FORM-FACTOR AND METHODS OF ASSEMBLING SAME

PRIORITY APPLICATION

This application claims the benefit of priority to Malaysian Application Serial Number PI 2017702412, filed Jun. 30, 2017, which is incorporated herein by reference in its entirety.

FIELD

This disclosure relates to capacitor integration into smaller form-factor packaging.

BACKGROUND

Semiconductive device miniaturization during packaging includes challenges to locate passive devices in useful proximity to other structures and to manage package physical integrity.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIGS. 6A, 6B and 6C illustrate stacked-die apparatus that use the stiffener-embedded passive devices according to an embodiment.

DETAILED DESCRIPTION

Figure 1:
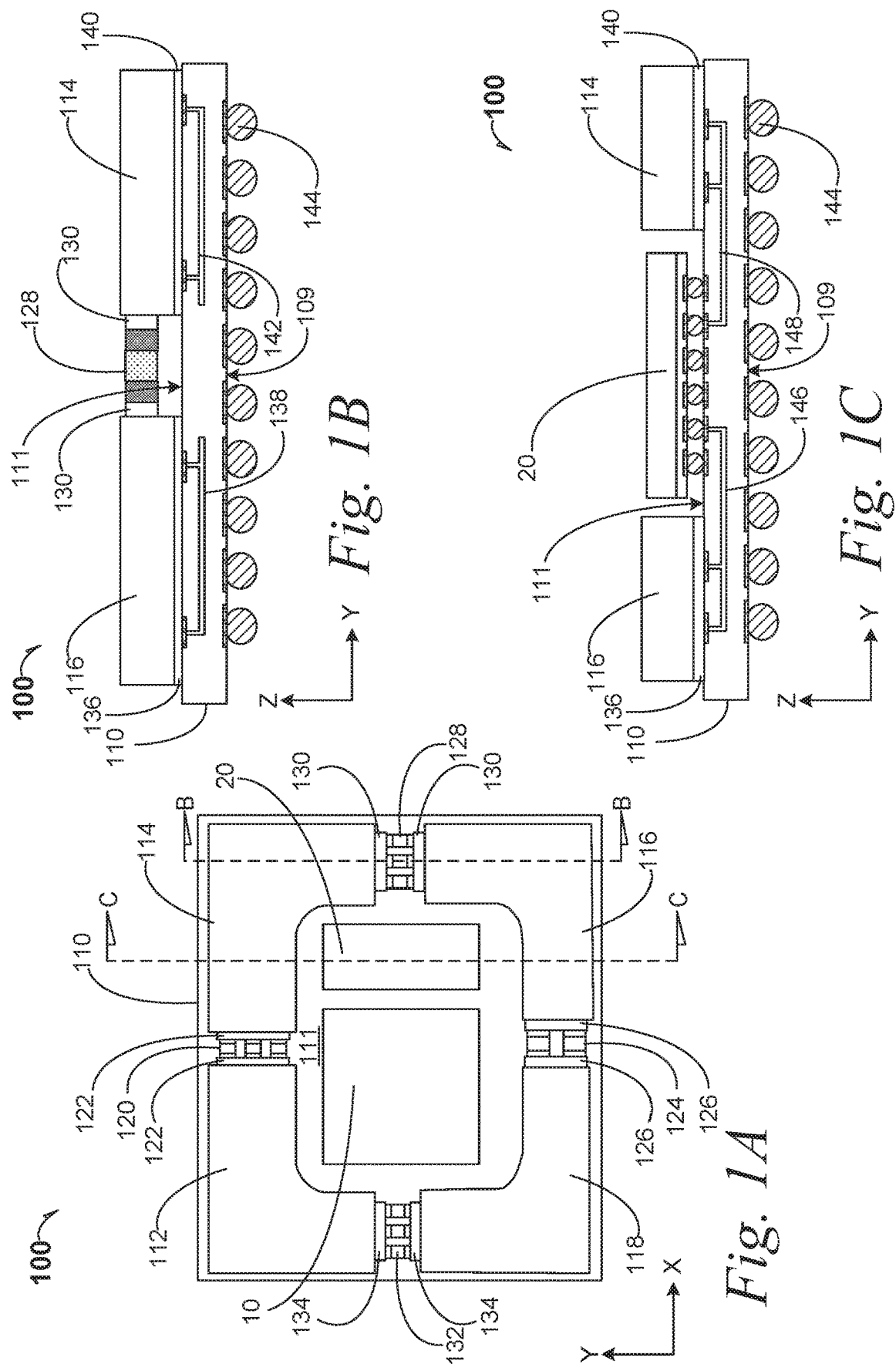
FIG. 1A is a top plan of a semiconductive apparatus that includes a package stiffener that incorporates passive components within both the footprint and profile according to an embodiment.
FIG. 1B is a cross-section elevation of the apparatus depicted in FIG. 1A according to an embodiment.
FIG. 1C is a cross-section elevation of the apparatus depicted in FIG. 1A according to an embodiment.

A die-side capacitor (DSC) is useful because it is locatable near an active device it is servicing. Disclosed embodiments include a DSC that is embedded in a package stiffener, both of which are located on the die side of a semiconductive device package. A trade-off for placing a passive device close to an active device is resolved by embedding the passive device in the package stiffener. The embedded passive device decreases the X-Y footprint of useful components on the die side of the semiconductive device package, and the stiffener-embedded DSC configuration also decreases a Z-direction profile through reduction of package layer count and/or package core layer thickness, for example.

This disclosure includes package form-factor miniaturization that includes the elimination of the need for a larger X-Y footprint although DSC installations are incorporated. Routing capacity is also increased by locating a given DSC at a useful distance from a semiconductive device such as a central processing unit.

By incorporating a DSC into a die-side stiffener, the land side of a package substrate is freed up for a fully populated ball-grid array for both I/O and power/ground routing. Consequently, no land-side capacitor (LSC) may be needed. Similarly, placing DSCs with the die-side stiffener can obviate the need for a recess-in package-board structures including motherboard type structures.

Disclosed embodiments exhibit useful power-integrity performance while providing a small X-Y footprint, a low Z-direction profile and still a DSC configuration creates shorter inductance loops and useful capacitor response times.

FIG. 1A is a top plan of a semiconductive apparatus 100 that includes a package stiffener that incorporates passive components within both the footprint and profile according to an embodiment. The package stiffener is mounted on a semiconductor package substrate 110 on a die side 111. In an embodiment, the semiconductor package stiffener includes component parts including a first part 112, a subsequent part 114, a third part 116 and a fourth part 118. In an embodiment, only two stiffener parts are used such that a first stiffener part is wired to VSS and a subsequent stiffener part is wired to VCC.

In an embodiment, active devices are disposed on the die side 111, such as a first die 10 and a supplemental die 20. In an embodiment, the first die 10 is a logic processor such as manufactured by Intel Corporation of Santa Clara, Calif. In an embodiment where the first die 10 is a processor, the supplemental die 20 is a platform-controller hub 20. As illustrated, the first die 10 and the supplemental die 20 are seated side-by-side in the infield region of the die side 111, where the infield region is created by the inner contours of the several stiffener parts 112, 114, 116 and 118.

In an embodiment, several dice are seated on the die side 111 such as a CPU die, a PCH die, a DRAM die, a graphic processing unit (GPU) die. In these embodiments, the die 10 is a first semiconductive device 10 and the die 20 is a subsequent semiconductive device 20.

The semiconductive devices 10 and 20, or one of them, may be located in an infield area of the die side 111, where the reference numeral 111 is located and that is within the central contours of the several stiffener parts 112, 114, 116 and 118.

In an embodiment, the stiffener first part 112 and stiffener subsequent part 114 are electrically connected in the circuitry and associated with respective reference voltages e.g., a ground (VSS) reference voltage and a power (VCC) reference voltage. In an embodiment, a series of passive devices such as capacitors are supplied between the stiffener first part 112 and the stiffener subsequent part 114. As illustrated, three capacitors are provided, one of which is indicated by reference number 120. Electrical connection is provided by electrical material such as a solder layer 122. The solder layer 122 is two distinct solder masses that connects the passive device 120 to two adjacent stiffener parts; in this instance the stiffener first part 112 and the stiffener subsequent part 114.

In an embodiment, the stiffener third part 116 and stiffener fourth part 118 are electrically connected in the circuitry of the package substrate 110, as respective VSS and VCC portions. In an embodiment, a series of passive devices such as capacitors are supplied between the stiffener third part 116 and the stiffener fourth part 118. As illustrated, two capacitors are provided, one of which is indicated by reference number 124. Electrical connection is provided by electrical material such as a solder layer 126.

In an embodiment, other capacitors 132 and 128 are provided between respective stiffener fourth- and first parts 118 and 112, and between respective stiffener subsequent- and third parts 114 and 116. The capacitors 132 are electrically connected by a solder layer 134 and similarly the capacitors 128 are electrically connected by a solder layer 130. The configuration of a passive device between two adjacent stiffener parts, that uses solder, may be referred to the passive device electrically contacting the two adjacent stiffener parts. This represents not intervening structures between the passive device electrodes and the solder, and likewise not intervening structures between the solder and the stiffener part.

In an embodiment, the stiffener parts comprise four subdivisions of a composite stiffener and each of the stiffener parts is separated from two adjacent stiffener parts, such that power (VCC) and ground (VSS) voltages may be connected such as for the stiffener parts 112, 114, 116 and 118 may be coupled by a polarity such as VSS-VCC-VSS-VCC.

In an embodiment, the stiffeners are made from aluminum metal plate. In an embodiment, the stiffeners are made from copper metal plate. In an embodiment, the stiffeners present a Z-direction profile in a range from 100 micrometer (μm) to 400 μm.

In any event, it can be seen in FIG. 1A that four stiffener parts are mounted on the die side 111 and each is separated from two adjacent stiffener parts by a gap that is bridged by at least one passive device. In an embodiment, the gap is bridged by a dummy device or a layer that provides no significant electrical functionality between the two adjacent stiffener parts.

FIG. 1B is a cross-section elevation of the apparatus 100 depicted in FIG. 1A according to an embodiment. The apparatus 100 depicts the capacitor 128 as well as the stiffener subsequent part 114 and stiffener third part 116 as seen from FIG. 1A taken from the section line B-B. Other passive devices can be located between any two adjacent stiffener parts in the gap illustrated for example between the stiffener subsequent part 114 and the stiffener third part 116. In any, event, the passive component provides an electrical coupling path between the adjacent stiffener parts.

The capacitor 128 is illustrated with end electrodes (darker) and the capacitor body (lighter), and the capacitor 128 is electrically coupled by direct contact to the solder layer 130. In turn, the solder layer 130 is electrically coupled to the respective subsequent and third stiffener parts 114 and 116 through the passive component such as the capacitor 128.

The package substrate 110 illustrates the stiffener third- and subsequent parts 116 and 114, each of which is affixed to the land side surface 111 by respective electrically conductive third and subsequent adhesive films 136 and 140. Electrical routing 138 is depicted within the semiconductor package substrate 110 under the stiffener third part 116. Similarly, electrical routing 142 is depicted within the semiconductor package substrate 110 under the stiffener subsequent part 114. Not illustrated is electrical routing that is directed orthogonal to the plane of the drawing that is coupled to a semiconductive device such as the CPU 10 depicted in FIG. 1A.

In an embodiment, a ball-grid array is disposed on a land side 109 of the semiconductor package substrate 110, one electrical bump of which is indicated by reference number 144. The electrical routing 138 and 142 illustrate routing that allows for circuitry to be directed across the capacitor 128 beginning at e.g., the stiffener subsequent part 114 and completing at the stiffener third part 116.

In an embodiment, the adhesive films are electrically conductive, which adhere the several stiffener parts to the die side 111. In an embodiment, the adhesive film is an anisotropic conductive film. In an embodiment, the adhesive film is a thermosetting epoxy-based film with electrically conductive particles such as silver or copper. For example, as illustrate in FIG. 1B, the adhesive films 136 and 140 (as well as adhesive films located below the stiffener first part 112 and stiffener fourth part 118 are electrically conductive to allow use of the several embedded capacitors 120, 124, 128 and 132. In an embodiment, the adhesive films have a thickness in a range from 20 μm to 30 μm.

In an embodiment, the passive components are capacitors such as XLP 0402, 0201, 01005. In an embodiment, the passive components are capacitors with pole-to-pole lengths from 400 μm to 1,000 μm. In an embodiment, the passive components are capacitors with widths from 200 μm to 500 μm. And in an embodiment, the passive components are capacitors with Z-direction profiles from 150 μm to 250 μm.

FIG. 1C is a cross-section elevation of the apparatus 100 depicted in FIG. 1A according to an embodiment. The apparatus 100 depicts the supplemental device 20 as well as the stiffener subsequent part 114 and the stiffener third part 116 as seen from FIG. 1A taken from the section line C-C. The supplemental device 20 is flip-chip bonded to the land side 111 of the package substrate 110. The package substrate 110 illustrates the stiffener third- and subsequent parts 116 and 114, each of which is affixed to the land side surface 111 by the respective third and subsequent adhesive films 136 and 140.

Electrical routing 146 is depicted within the semiconductor package substrate 110 under the stiffener third part 116 such that the supplemental device 20 allows circuitry to be directed to the stiffener third part 116 and consequently into at least one of the capacitors 124 and 128 (see FIG. 1). Similarly, electrical routing 148 is depicted within the semiconductor package substrate 110 under the stiffener subsequent part 114 such that the supplemental device 20 allows circuitry to be directed to the stiffener subsequent part 114 and consequently into at least one of the capacitors 120 and 128. The ball-grid array 144 is also indicated on the land side 109 of the semiconductor package substrate 110.

Figure 2:
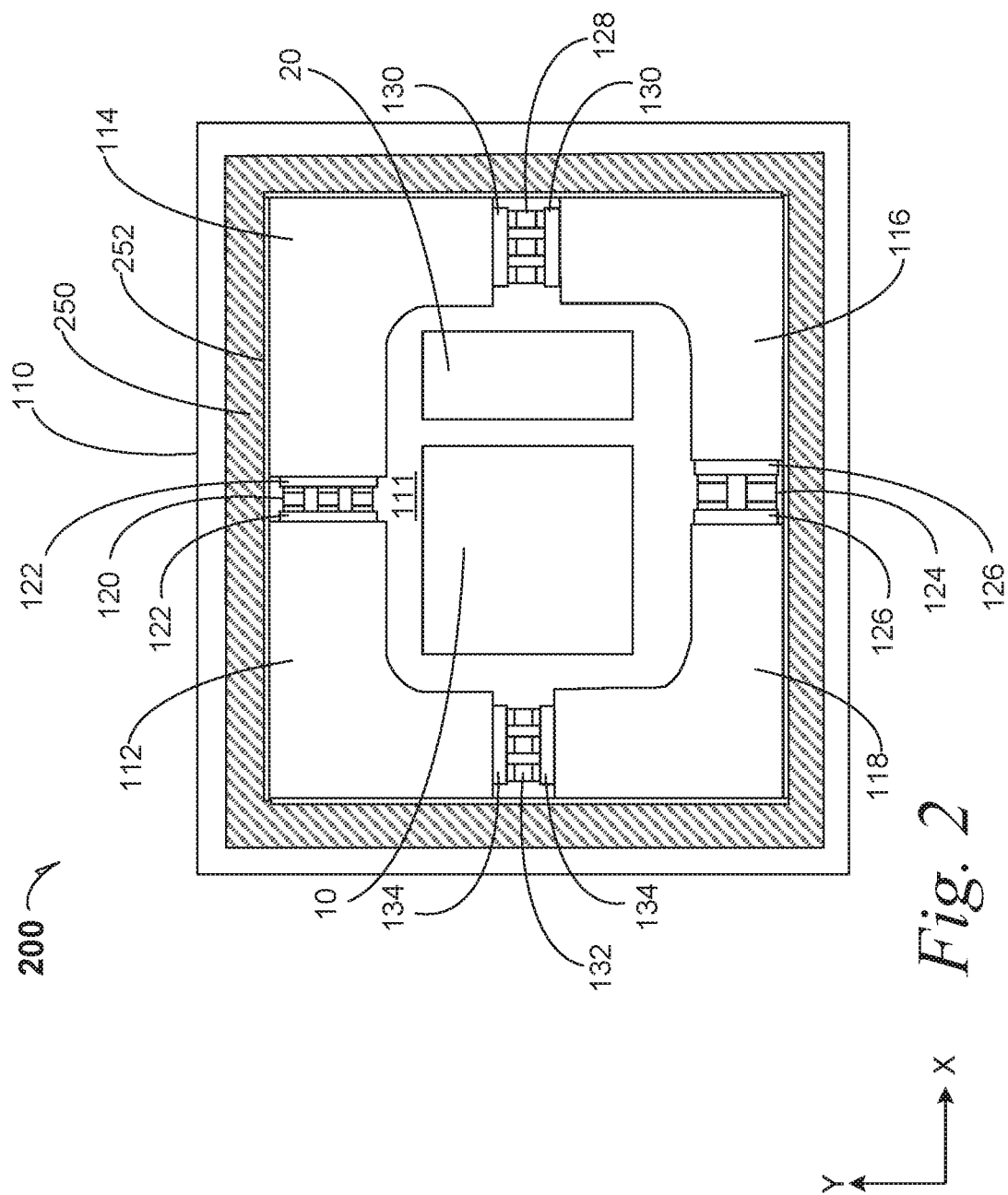
FIG. 2 is a top plan of a semiconductive apparatus that includes a package stiffener that incorporates passive components within both the X-Y footprint and the Z-profile, and an external-frame stiffener is provided according to an embodiment.

FIG. 2 is a top plan of a semiconductive apparatus 200 that includes a package stiffener that incorporates passive components within both the footprint and the Z-profile, and an external-frame stiffener is provided according to an embodiment.

The semiconductor package stiffener is mounted on a semiconductor package substrate 110 on a die side 111. In an embodiment, the semiconductor package stiffener includes component parts including a first part 112, a subsequent part 114, a third part 116 and a fourth part 118. In an embodiment, the external-frame stiffener 250 is insulated from the several stiffener parts 112, 114, 116 and 118 by an insulating adhesive 252. The insulating adhesive 252 allows for the several stiffener parts 112, 114, 116 and 118 to act as polarity opposites similarly to the apparatus 100 depicted in FIG. 1, while combining with the integral structure of the external-frame stiffener 250, which provides extra 3-dimensional stiffness for the semiconductive apparatus 200.

FIGS. 3A, 3B, 3C, 3D, 3E and 3F represent fabrication of a stiffener-embedded passive device assembly according to an embodiment. The order of presentation is changeable according to a given processing embodiment. For example, testing of a seated semiconductive device may precede affixing stiffener parts such as by using a probe that mimics the effects of seated stiffener parts.

Figure 3A:
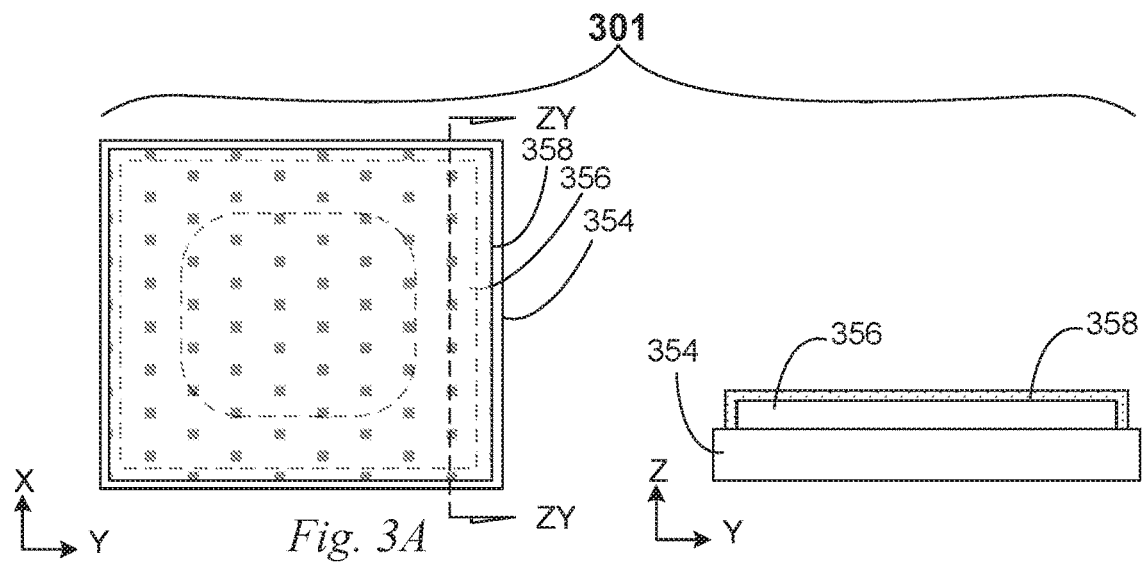
FIGS. 3A, 3B, 3C, 3D, 3E and 3F represent fabrication of a stiffener-embedded passive device assembly according to an embodiment.

FIG. 3A is a depiction of fabrication for a stiffener-embedded passive device assembly 301 during processing according to an embodiment. A carrier 354 supports a stiffener precursor 356 during fabrication, and a mask 358 such as a dry-film resist (DFR) covers the stiffener precursor 356. In an embodiment, the carrier 354 includes adhesive layer (not shown) to support the stiffener precursor 356 during fabrication. The top (X-Y) view illustrates the stiffener precursor 356 in ghosted lines to indicate coverage by the mask 358. A cross-section elevation is also depicted and taken from the plan view, taken along the section line ZY-ZY.

Figure 3B:
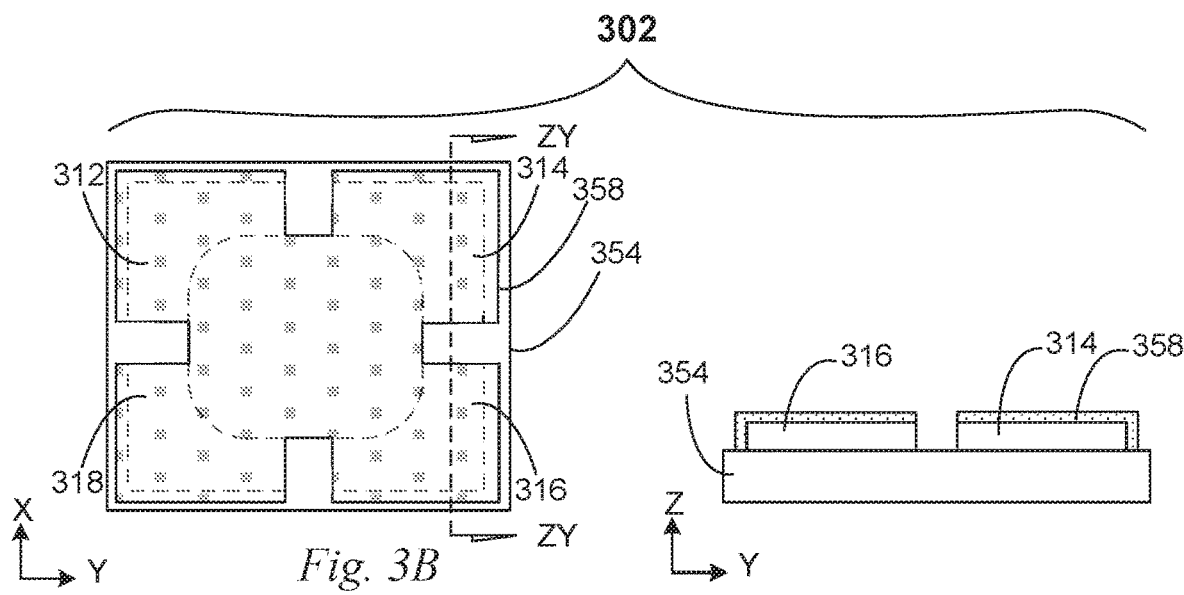

FIG. 3B is a depiction of fabrication for the stiffener-embedded passive device assembly 301 depicted in FIG. 3A after further processing according to an embodiment. The stiffener-embedded passive device assembly 302 has been processed by patterning the mask 358 and etching into the stiffener precursor 356 depicted in FIG. 3A, to singulate the precursor into a stiffener first part 312, a stiffener subsequent part 314, a stiffener third part 316 and a stiffener fourth part 318. A cross-section elevation is also depicted and taken from the plan view, taken along the section line ZY-ZY. The stiffener subsequent part 314 and the stiffener third part 316 have been formed and the mask 358 remains patterned. In an embodiment, singulating the several stiffener parts is done by laser drilling. In an embodiment, singulating the several stiffener parts is done by directional etching. In an embodiment, singulating the several stiffener parts is done by wet etching.

Figure 3C:
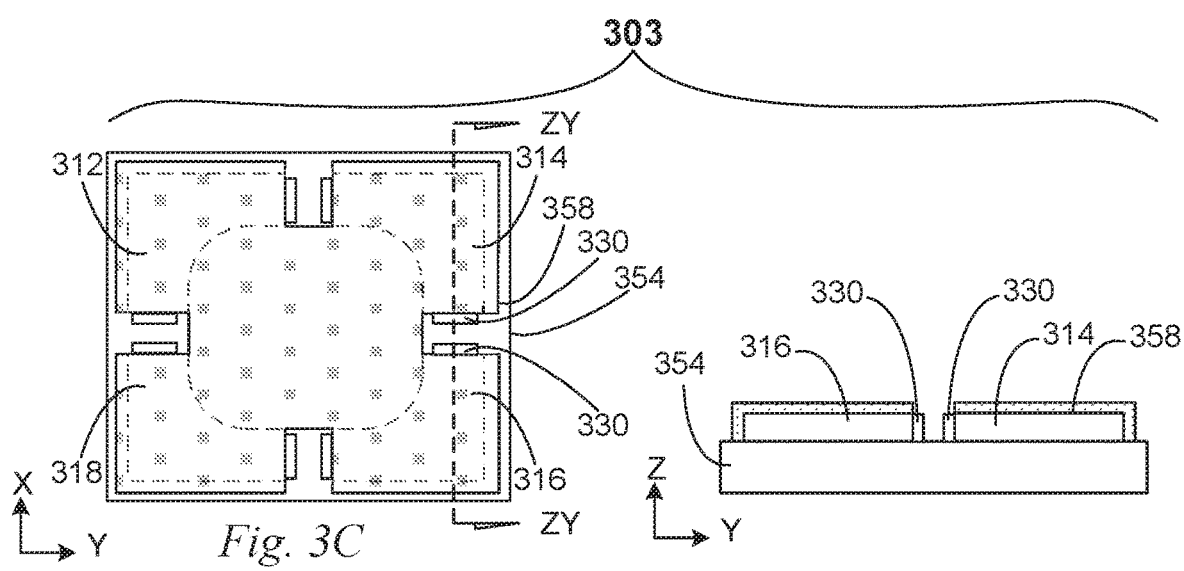

FIG. 3C is a depiction of fabrication for the stiffener-embedded passive device assembly 302 depicted in FIG. 3B after further processing according to an embodiment. A cross-section elevation is also depicted and taken from the plan view, taken along the section line ZY-ZY. The stiffener-embedded passive device assembly 303 has been processed by forming a solder layer 330 that abuts the respective stiffener subsequent and third parts 314 and 316. In an embodiment, forming the solder layer 330 is done by solder paste printing. In an embodiment, forming the solder layer 330 is done by solder electroplating. In an embodiment, removing the mask 358 is done by chemical wet etching.

Figure 3D:
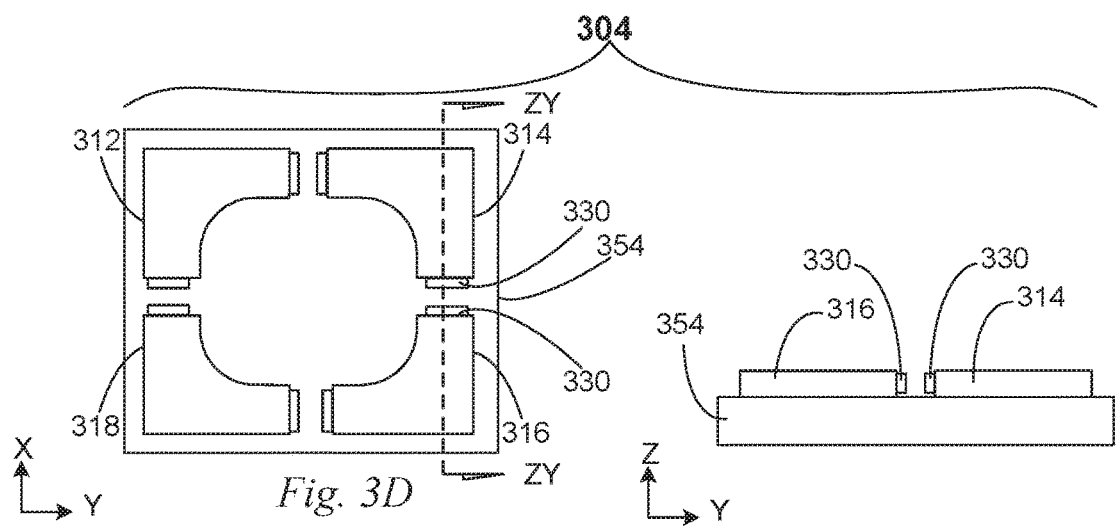

FIG. 3D is a depiction of fabrication for the stiffener-embedded passive device assembly 303 depicted in FIG. 3C after further processing according to an embodiment. A cross-section elevation is also depicted and taken from the plan view, taken along the section line ZY-ZY. The stiffener-embedded passive device assembly 304 has been processed by removing the mask 358 depicted in FIG. 3C. Further processing includes forming a solder layer that abuts the respective stiffener subsequent and third parts 314 and 316

Figure 3E:
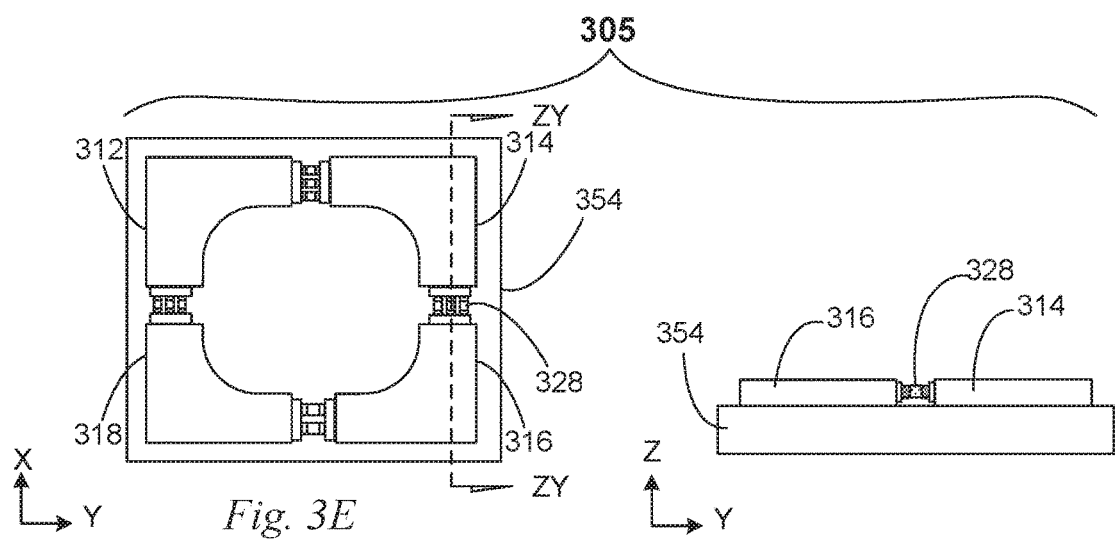

FIG. 3E is a depiction of fabrication for the stiffener-embedded passive device assembly 304 depicted in FIG. 3D after further processing according to an embodiment. A cross-section elevation is also depicted and taken from the plan view, taken along the section line ZY-ZY. The stiffener-embedded passive device assembly 305 has been processed by placing passive devices such as decoupling capacitors 328 between the several stiffener parts. In an embodiment, placing the passive devices such as decoupling capacitors is done by surface mounting and/or solder reflow, for example.

In an embodiment to achieve the external-frame stiffener 250, the insulating adhesive 252 is attached to the several stiffener parts 112, 114, 116 and 118. Next, the external-frame stiffener 250 is heated under conditions to cause the external-frame stiffener to expand sufficient to slip the external-frame stiffener 250 over the insulating adhesive 252, and thereafter allow the external-frame stiffener 250 to both heat activate the insulating adhesive 252 and by heat transfer between the external-frame stiffener 250 and the insulating adhesive 252, to obtain a physical bond between the external-frame stiffener 250 and the several stiffener parts 112, 114, 116 and 118.

Further processing after assembly of the several passive devices is done by removing the carrier 354 and seating the assembly onto a package substrate such as the package substrate 110 depicted in FIGS. 1A, 1B and 1C. Where the external-frame stiffener 250 is used, further processing after assembly of the several passive devices is done by removing the carrier 354 and seating the assembly onto a package substrate such as the package substrate 110 depicted in FIG. 2.

Figure 3F:
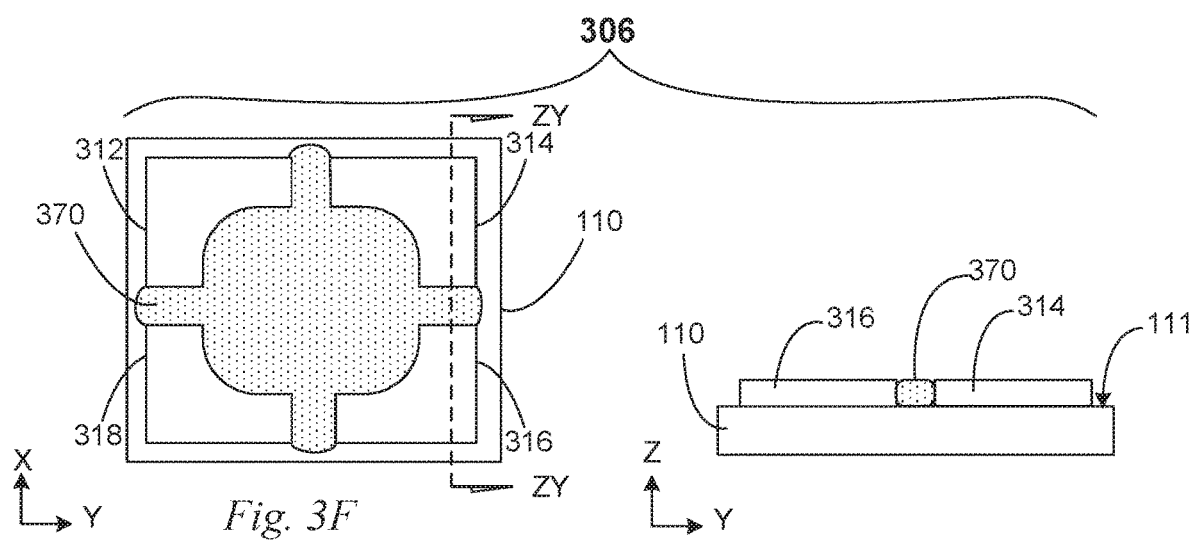

FIG. 3F is a depiction of fabrication for the stiffener-embedded passive device assembly 305 depicted in FIG. 3E after further processing according to an embodiment. After seating of devices on the package substrate die side 111 (see, e.g. FIGS. 1A and 2), an overmolding material 370 is filled onto the die side 111 and over the active and passive devices. This process allows for an increased stiffness of the package as well as physical protection for the several active and passive devices.

Figure 4:
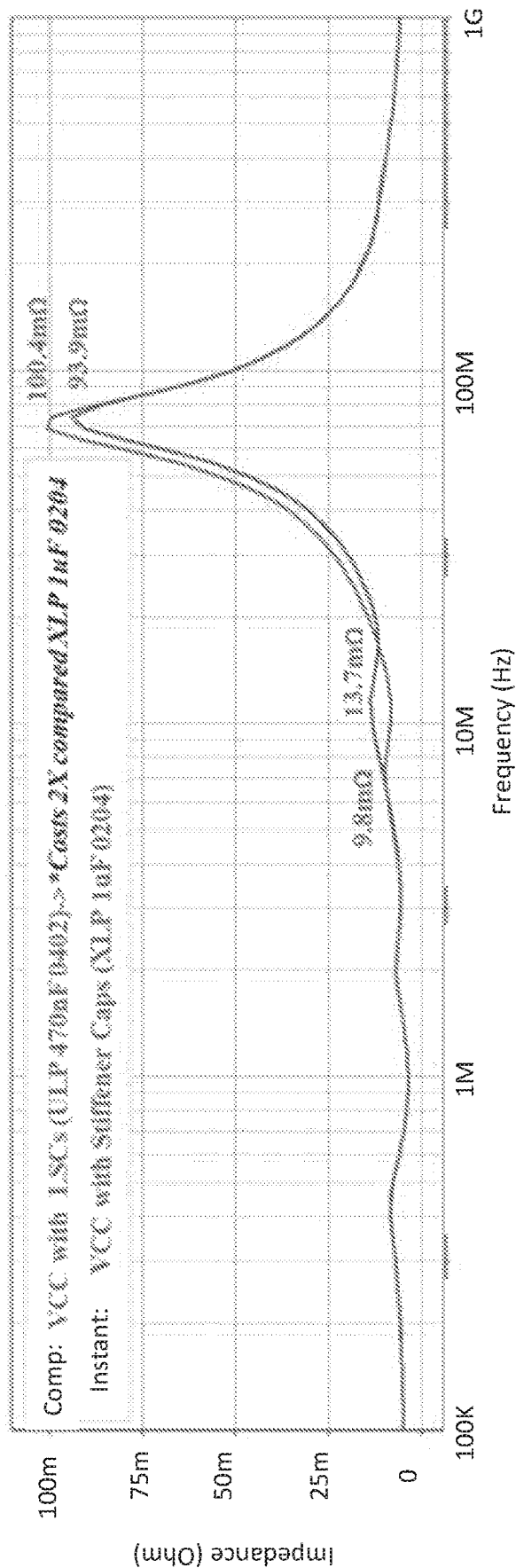
FIG. 4 is a comparison of power integrity according to an embodiment.

FIG. 4 is a comparison of power integrity according to an embodiment. The comparison includes a comparative apparatus that uses land-side capacitors (LSCs) that are located directly below a die such as the first die 10. The comparison is made, to a disclosed apparatus embodiment, that uses stiffener-embedded die-side capacitor embodiments. In this comparison, extra-low profile (XLP) capacitor with industrial common z-profile e.g., 220 μm is used in the stiffener-embedded die-side capacitor embodiment to compare against the power integrity performance using ultra-low profile (IMP) LSC with reduced z-profile (e.g., 150 μm) in order to fit within the gap between the package land side (e.g., land side 109) and the board (e.g., motherboard 660 shown in FIG. 6C). Besides increased component costs and limited component dimension profile availability in the market, the ULP capacitors may also yield less useful electrical performance e.g., higher equivalent series resistance (ESR) compare to the XLP capacitors given similar component dimension. The comparison illustrates a comparable impedance profiles between the comparative and the disclosed apparatuses at a resonant frequency (e.g., about 70 MHz). Thus, the stiffener-embedded passive device for the semiconductive apparatus allows system component costs reduction while preserving the power integrity performance.

Figure 5:
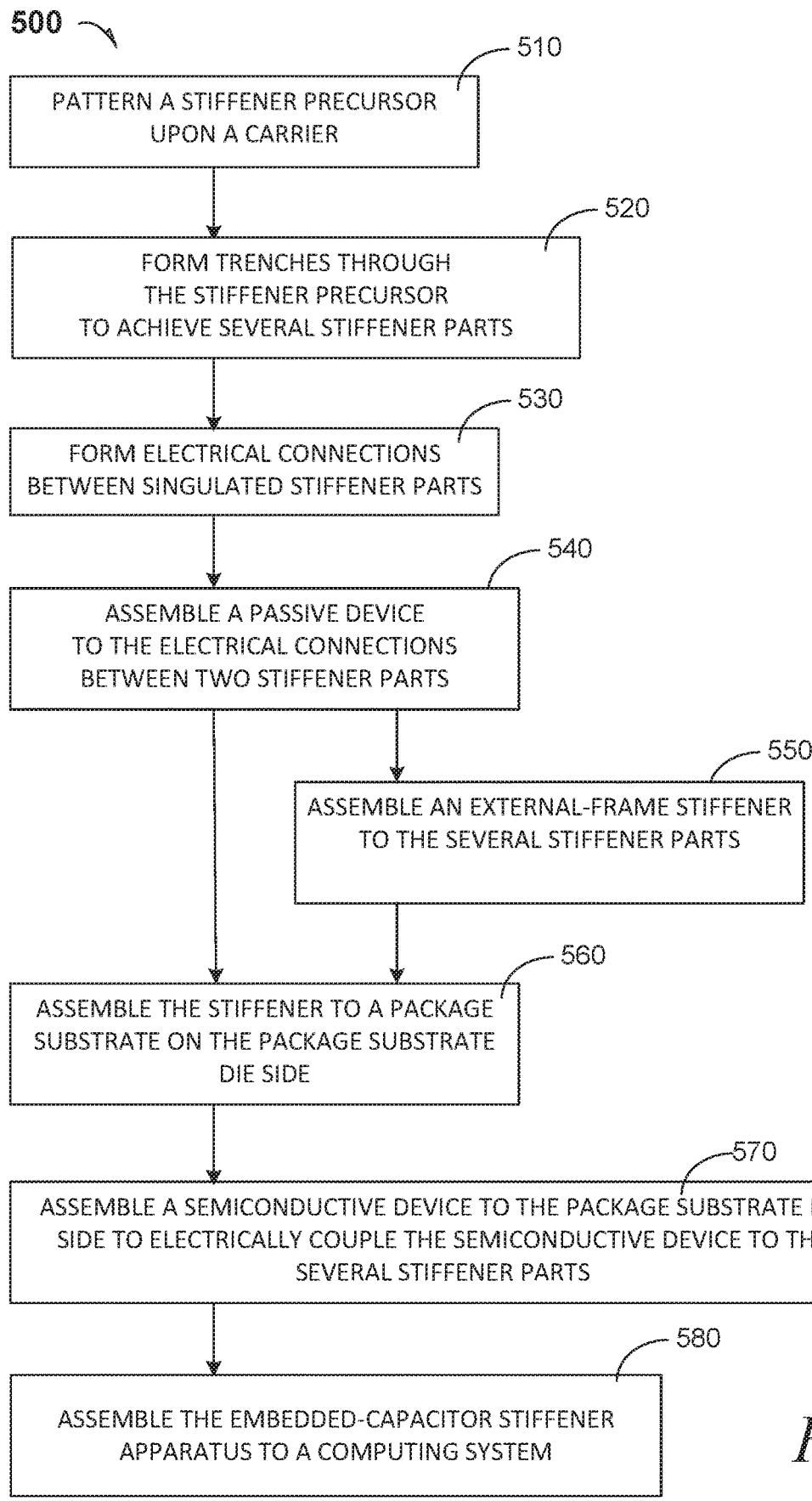
FIG. 5 is a process flow diagram 500 according to several embodiments.

FIG. 5 is a process flow diagram 500 according to an embodiment.

At 510, the process includes patterning a stiffener precursor. The process includes patterning a mask upon the stiffener precursor.

At 520, the process includes forming trenches through the stiffener precursor to achieve singulated stiffener parts.

At 530, the process includes forming an electrical connection between two adjacent singulated stiffener parts. In an example embodiment, a solder layer 130 is soldered to the stiffener third and subsequent parts 116 and 114.

At 540, the process includes assembling a passive device to the electrical connections between two adjacent stiffener parts. In an example embodiment, the capacitor 128 is soldered into place at the solder layer 130.

At 550, the process includes assembling an external-frame stiffener to the several stiffener parts.

At 560, the process includes assembling the stiffener onto a package substrate at the package substrate die side.

At 570, the process includes assembling a semiconductive device to the package substrate die side to electrically couple the semiconductive device to the several stiffener parts.

At 580, the process includes assembling the semiconductive apparatus that contains the embedded-capacitor stiffener assembly to a computing system.

FIGS. 6A, 6B and 6C illustrate stacked-die apparatus 600 that use the stiffener-embedded passive devices according to an embodiment. Similar structures and configurations may be referenced from FIGS. 1A and 1C.

FIG. 6A illustrates a stacked supplemental first die 70 and a stacked supplemental subsequent die 80 (seen in FIG. 6B when viewed from the cross-section line B-B, taken from FIG. 6A). The stacked supplemental first die 70 is connected through the backside of the supplemental die 20 by several through-silicon vias (TSVs) 12. The stacked supplemental subsequent die 80 is connected through the backside of the supplemental die 20 by several TSVs 13. The several TSVs 12 and 13 are illustrated in FIG. 6B by two groupings of nominal eight TSVs 12 and 13. In an embodiment, the stacked supplemental first die 70 is a baseband processor and the stacked supplemental subsequent die 80 is a transceiver. The overall Z-direction profile of the stiffener parts, e.g., the stiffener subsequent part 114 and stiffener third part 116, is higher than the highest part of the stacked supplemental dice 70 and 80, such that the die stack 20, 70 and 80 is physically protected by the stiffener parts in the Z-profile.

FIG. 6C is taken from FIG. 6A along the cross-section line C-C. In an embodiment where the logic die 10 is a processor 10, a memory die 60 is flip-chip mounted on the logic die 10. The memory die 60 is connected through the backside of the logic die 10 by several through-silicon vias (TSVs) 11. The several TSVs 11 are illustrated in FIG. 6C by two groupings of nominal eight TSVs 11 according to an embodiment. The overall Z-direction profile of the stiffener parts, e.g., the stiffener first part 112 and stiffener fourth part 118, is higher than the highest part of the memory die 60, such that the die stack 10 and 60 is physically protected by the stiffener parts in the Z-profile. FIG. 6C shows electrical routing 646 and 648, whereas FIG. 6B shows electrical routing 146 and 148.

As depicted in FIG. 6C and in an embodiment for all package substrates 110, the electrical bump array 144 is seated onto a board 660 such as a motherboard 660. In an embodiment, the board 660 includes a physical and electrically insulative shell 662 such as the outer shell of a computing system. Processing to seat the package substrate 110 onto the board 660 is illustrated by the directional arrows, depicted in dashed lines, that illustrate movement of the package substrate 110 toward the board 660.

In an embodiment, the stacked-die apparatus 600, depicted in FIGS. 6A, 6B and 6C, includes an external-frame stiffener such as the external-frame stiffener 250 as well as the insulating adhesive 252 depicted in FIG. 2.

Figure 7:
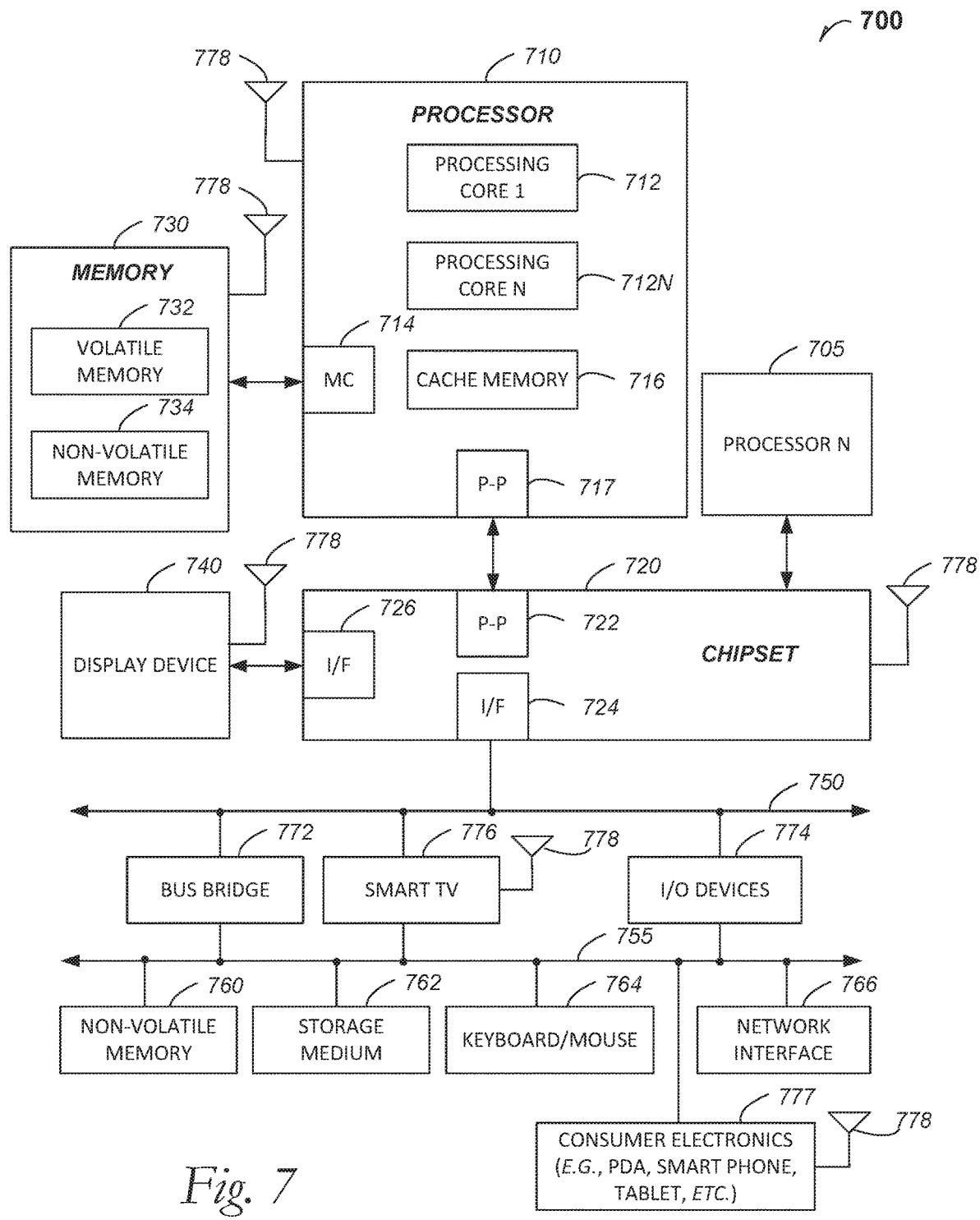
FIG. 7 is included to show an example of a higher level device application for the disclosed embodiments.

FIG. 7 is included to show an example of a higher level device application for the disclosed embodiments. The stiffener-embedded passive device for semiconductive apparatus embodiments may be found in several parts of a computing system. In an embodiment, the stiffener-embedded passive device for semiconductive apparatus is part of a communications apparatus such as is affixed to a cellular communications tower. The stiffener-embedded passive device for semiconductive apparatus may also be referred to as composite stiffener incorporating a passive device apparatus. In an embodiment, a computing system 700 includes, but is not limited to, a desktop computer. In an embodiment, a system 700 includes, but is not limited to a laptop computer. In an embodiment, a system 700 includes, but is not limited to a netbook. In an embodiment, a system 700 includes, but is not limited to a tablet. In an embodiment, a system 700 includes, but is not limited to a notebook computer. In an embodiment, a system 700 includes, but is not limited to a personal digital assistant (PDA). In an embodiment, a system 700 includes, but is not limited to a server. In an embodiment, a system 700 includes, but is not limited to a workstation. In an embodiment, a system 700 includes, but is not limited to a cellular telephone. In an embodiment, a system 700 includes, but is not limited to a mobile computing device. In an embodiment, a system 700 includes, but is not limited to a smart phone. In an embodiment, a system 700 includes, but is not limited to an internet appliance. Other types of computing devices may be configured with the microelectronic device that includes stiffener-embedded passive device for semiconductive apparatus embodiments.

In an embodiment, the processor 710 has one or more processing cores 712 and 712N, where 712N represents the Nth processor core inside processor 710 where N is a positive integer. In an embodiment, the electronic device system 700 using a MAA apparatus embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the MAA apparatus in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a MAA apparatus embodiment as set forth in this disclosure. The chipset 720 enables the processor 710 to connect to other elements in the stiffener-embedded passive device for semiconductive apparatus embodiments in a system 700. In an embodiment, interfaces 717 and 722 operate in accordance with a PtP communication protocol such as the Intel® QuickPath interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a stiffener-embedded passive device for semiconductive apparatus in a system. Additionally, the chipset 720 connects to one or more buses 750 and 755 that interconnect various elements 774, 760, 762, 764, and 766. Buses 750 and 755 may be interconnected together via a bus bridge 772 such as at least one stiffener-embedded passive device for semiconductive apparatus embodiment. In an embodiment, the chipset 720, via interface 724, couples with a non-volatile memory 760, a mass storage device(s) 762, a keyboard/mouse 764, a network interface 766, smart TV 776, consumer electronics 777, etc.

In an embodiment, the mass storage device 762 includes, but is not limited to, a solid state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (MB), Bluetooth, WiMax, or any form of wireless communication protocol.

While the modules shown in FIG. 7 are depicted as separate blocks within the stiffener-embedded passive device for semiconductive apparatus embodiment in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

Where useful, the computing system 700 may have a broadcasting structure interface such as for affixing the stiffener-embedded passive device for semiconductive apparatus to a cellular tower.

To illustrate the stiffener-embedded passive device for semiconductive apparatus embodiments and methods disclosed herein, a non-limiting list of examples is provided herein:

Example 1 is a semiconductive apparatus, comprising: a semiconductor package substrate including a die side and a land side; a stiffener disposed on the die side, wherein the stiffener includes a stiffener first part and a stiffener subsequent part, wherein the stiffener first part is electrically coupled to the semiconductor package substrate by an electrically conductive first adhesive, and wherein the stiffener subsequent part is electrically coupled to the semiconductor package substrate by an electrically conductive subsequent adhesive; and a passive device electrically contacting the stiffener first part and the stiffener subsequent part by a solder layer.

In Example 2, the subject matter of Example 1 optionally includes a semiconductive device electrically coupled to the semiconductor package substrate die side and electrically coupled to at least one of the stiffener parts.

In Example 3, the subject matter of any one or more of Examples 1-2 optionally include a semiconductive device electrically coupled to the semiconductor package substrate die side and electrically coupled to at least one of the stiffener parts, and wherein the passive device is a capacitor with a width in a range from 200 μm to 500 μm, a length in a range from 400 μm to 1,000 μm, and a height in a range from 150 μm to 250 μm.

In Example 4, the subject matter of any one or more of Examples 1-3 optionally include wherein the stiffener further includes a stiffener third part and a stiffener fourth part, each of which is electrically coupled to the semiconductor package substrate by respective electrically conductive third and fourth adhesives.

In Example 5, the subject matter of Example 4 optionally includes a semiconductive device electrically coupled to the semiconductor package substrate die side, wherein the stiffener includes a first Z-direction profile, the semiconductive device includes a second Z-direction profile, wherein the second profile is lower than the first profile.

In Example 6, the subject matter of any one or more of Examples 1-5 optionally include wherein the stiffener further includes: a stiffener third part including an electrically conductive third adhesive that couples the stiffener third part to the semiconductor package substrate; a stiffener fourth part including an electrically conductive fourth adhesive that couples the stiffener fourth part to the semiconductor package substrate; a passive device electrically contacting the stiffener subsequent part and the stiffener third part; a passive device electrically contacting the stiffener third part and the stiffener fourth part; and a passive device electrically contacting the stiffener fourth part and the stiffener first part.

In Example 7, the subject matter of Example 6 optionally includes a semiconductive device electrically coupled to the semiconductor package substrate die side, wherein the stiffener includes a first Z-direction profile, the semiconductive device includes a second Z-direction profile, wherein the second profile is lower than the first profile.

In Example 8, the subject matter of any one or more of Examples 1-7 optionally include wherein the stiffener further includes: a stiffener third part including an electrically conductive third adhesive that couples the stiffener third part to the semiconductor package substrate; a stiffener fourth part including an electrically conductive fourth adhesive that couples the stiffener fourth part to the semiconductor package substrate; a passive device electrically contacting the stiffener subsequent part and the stiffener third part; a passive device electrically contacting the stiffener third part and the stiffener fourth part; a passive device electrically contacting the stiffener fourth part and the stiffener first part; and a semiconductive device electrically coupled to the semiconductor package substrate die side.

In Example 9, the subject matter of any one or more of Examples 1-8 optionally include wherein the stiffener further includes: a stiffener third part including an electrically conductive third adhesive that couples the stiffener third part to the semiconductor package substrate; a stiffener fourth part including an electrically conductive fourth adhesive that couples the stiffener fourth part to the semiconductor package substrate; a passive device electrically contacting the stiffener subsequent part and the stiffener third part; a passive device electrically contacting the stiffener third part and the stiffener fourth part; a passive device electrically contacting the stiffener fourth part and the stiffener first part; and a semiconductive device electrically coupled to the semiconductor package substrate die side and electrically coupled to at least one of the stiffener parts.

In Example 10, the subject matter of any one or more of Examples 1-9 optionally include wherein the stiffener further includes: a stiffener third part including an electrically conductive third adhesive that couples the stiffener third part to the semiconductor package substrate; a stiffener fourth part including an electrically conductive fourth adhesive that couples the stiffener fourth part to the semiconductor package substrate; a passive device electrically contacting the stiffener subsequent part and the stiffener third part; a passive device electrically contacting the stiffener third part and the stiffener fourth part; a passive device electrically contacting the stiffener fourth part and the stiffener first part; a first semiconductive device electrically coupled to the semiconductor package substrate die side; and a subsequent semiconductive device electrically coupled to the semiconductor package substrate die side, wherein the first semiconductive device and the subsequent semiconductive device are disposed side-by-side on the semiconductor package die side.

In Example 11, the subject matter of any one or more of Examples 1-10 optionally include wherein the stiffener further includes: a stiffener third part including an electrically conductive third adhesive that couples the stiffener third part to the semiconductor package substrate; a stiffener fourth part including an electrically conductive fourth adhesive that couples the stiffener fourth part to the semiconductor package substrate; a passive device electrically contacting the stiffener subsequent part and the stiffener third part; a passive device electrically contacting the stiffener third part and the stiffener fourth part; a passive device electrically contacting the stiffener fourth part and the stiffener first part; a first semiconductive device electrically coupled to the semiconductor package substrate die side; and a first stacked semiconductive device stacked on first semiconductive device, wherein the stiffener includes a first Z-direction profile, the first stacked semiconductive device exhibits a second Z-direction profile, wherein the second profile is lower than the first profile.

In Example 12, the subject matter of any one or more of Examples 1-11 optionally include a first semiconductive device central processing unit electrically coupled to the semiconductor package substrate die side and electrically coupled through the semiconductor package substrate to at least one of the stiffener parts; and a supplemental semiconductive device platform controller hub electrically coupled to the semiconductor package substrate die side and electrically coupled through the semiconductive package substrate to at least one of the stiffener parts.

In Example 13, the subject matter of any one or more of Examples 1-12 optionally include a first semiconductive device and electrically coupled to the semiconductor package substrate die side and electrically coupled through the semiconductor package substrate to at least one of the stiffener parts; and a subsequent semiconductive device and electrically coupled to the semiconductor package substrate die side and electrically coupled through the semiconductor package substrate to at least one of the stiffener parts, and wherein the first and subsequent semiconductive devices are disposed side-by-side at an infield area of the semiconductor package substrate die side.

In Example 14, the subject matter of any one or more of Examples 1-13 optionally include an external-frame stiffener that encompasses the stiffener first part and the stiffener subsequent part, wherein the external-frame stiffener is insulated from the several stiffener parts by an insulating adhesive.

Example 15 is a method of assembling a stiffener to a semiconductor package substrate, comprising: patterning a stiffener precursor to singulate the stiffener precursor into a stiffener first part and a stiffener subsequent part; assembling the stiffener first part to a first electrically conductive adhesive on a semiconductor package substrate die side; wherein the first electrically conductive adhesive makes electrical connection to a trace in the semiconductor package substrate; assembling the stiffener subsequent part to a subsequent electrically conductive adhesive on the semiconductor package substrate die side, wherein the first electrically conductive adhesive makes electrical connection to a trace in the semiconductor package substrate, wherein a gap is left between the stiffener first part and the stiffener subsequent part; and electrically contacting the stiffener first part and the stiffener subsequent part with a passive device that is positioned to fill the gap.

In Example 16, the subject matter of Example 15 optionally includes wherein patterning the stiffener precursor includes singulating the stiffener first part, the stiffener subsequent part, a stiffener third part and a stiffener fourth part, further including: assembling the stiffener third part to a third electrically conductive adhesive on a semiconductor package substrate die side, wherein the third electrically conductive adhesive makes electrical connection to a trace in the semiconductor package substrate; assembling the stiffener fourth part to a fourth electrically conductive adhesive on a semiconductor package substrate die side, wherein the fourth electrically conductive adhesive makes electrical connection to a trace in the semiconductor package substrate; electrically contacting the stiffener subsequent part and the stiffener third part with a passive device; electrically contacting the stiffener third part and the stiffener fourth part with a passive device; and seating a semiconductive device on the semiconductor package die side wherein the semiconductive device is electrically connected to at least two stiffener parts.

In Example 17, the subject matter of Example 16 optionally includes wherein the semiconductive device is a semiconductive first device, further including seating a semiconductive subsequent device on the semiconductor package substrate die side, side-by-side with the semiconductive first device.

In Example 18, the subject matter of any one or more of Examples 15-17 optionally include attaching an external-frame stiffener to encompass the stiffener first part and the stiffener subsequent part, wherein the external-frame stiffener is insulated from the several stiffener parts by an insulating adhesive.

Example 19 is a computing system, comprising: a semiconductor package substrate including a die side and a land side; a semiconductive device seated on the semiconductor package substrate die side; a stiffener disposed on the die side, wherein the stiffener includes a stiffener first part and a stiffener subsequent part, wherein the stiffener first part is electrically coupled to the semiconductor package substrate by an electrically conductive first adhesive, and wherein the stiffener subsequent part is electrically coupled to the semiconductor package substrate by an electrically conductive subsequent adhesive; and a passive device electrically contacting the stiffener first part and the stiffener subsequent part by a solder layer; and a shell coupled to a board, wherein the board is coupled to the semiconductor package substrate at the land side, wherein the semiconductive device is electrically coupled through the stiffener first part and stiffener subsequent part through the passive device, and wherein the shell electrically insulates the board.

In Example 20, the subject matter of Example 19 optionally includes a stiffener third part including an electrically conductive third adhesive that couples the stiffener third part to the semiconductor package substrate; a stiffener fourth part including an electrically conductive fourth adhesive that couples the stiffener fourth part to the semiconductor package substrate; a passive device electrically contacting the stiffener subsequent part and the stiffener third part; a passive device electrically contacting the stiffener third part and the stiffener fourth part; and a passive device electrically contacting the stiffener fourth part and the stiffener first part, and wherein the semiconductive device is a semiconductive first device, further including a semiconductive subsequent device seated on the semiconductor package substrate die side, side-by-side with the semiconductive first device.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation; or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductive apparatus, comprising:
a semiconductor package substrate including a die side and a land side;
a stiffener disposed on the die side, wherein the stiffener includes a stiffener first part and a stiffener subsequent part, wherein the stiffener first part is electrically coupled to the semiconductor package substrate by an electrically conductive first adhesive, wherein the stiffener subsequent part is electrically coupled to the semiconductor package substrate by an electrically conductive subsequent adhesive, and wherein one of the stiffener first part and stiffener subsequent part is coupled to power and the other of the stiffener first part and stiffener subsequent part is coupled to ground;
a passive device electrically contacting the stiffener first part and the stiffener subsequent part by a solder layer; and a semiconductive device electrically coupled to the semiconductor package substrate die side and electrically coupled to at least one of the stiffener parts.

2. The semiconductive apparatus of claim 1, wherein the passive device is a capacitor with a width in a range from 200 μm to 500 μm, a length in a range from 400 μm to 1.000 μm, and a height in a range from 150 μm to 250 μm.

3. The semiconductive apparatus of claim 1, wherein the stiffener further includes a stiffener third part and a stiffener fourth part, each of which is electrically coupled to the semiconductor package substrate by respective electrically conductive third and fourth adhesives.

4. The semiconductive apparatus of claim 3, wherein the stiffener includes a first Z-direction profile, the semiconductive device includes a second Z-direction profile, wherein the second profile is lower than the first profile.

5. The semiconductive apparatus of claim 1, wherein the stiffener further includes:
   a stiffener third part including an electrically conductive third adhesive that couples the stiffener third part to the semiconductor package substrate;
   a stiffener fourth part including an electrically conductive fourth adhesive that couples the stiffener fourth part to the semiconductor package substrate;
   a passive device electrically contacting the stiffener subsequent part and the stiffener third part;
   a passive device electrically contacting the stiffener third part and the stiffener fourth part; and
   a passive device electrically contacting the stiffener fourth part and the stiffener first part.

6. The semiconductive apparatus of claim 5, wherein the stiffener includes a first Z-direction profile, the semiconductive device includes a second Z-direction profile, wherein the second Z-direction profile is lower than the first Z-direction profile.

7. The semiconductive apparatus of claim 1, wherein the stiffener further includes:
   a stiffener third part including an electrically conductive third adhesive that couples the stiffener third part to the semiconductor package substrate;
   a stiffener fourth part including an electrically conductive fourth adhesive that couples the stiffener fourth part to the semiconductor package substrate;
   a passive device electrically contacting the stiffener subsequent part and the stiffener third part;
   a passive device electrically contacting the stiffener third part and the stiffener fourth part; and
   a passive device electrically contacting the stiffener fourth part and the stiffener first part.

8. The semiconductive apparatus of claim 1, wherein the stiffener further includes:
   a stiffener third part including an electrically conductive third adhesive that couples the stiffener third part to the semiconductor package substrate;
   a stiffener fourth part including an electrically conductive fourth adhesive that couples the stiffener fourth part to the semiconductor package substrate;
   a passive device electrically contacting the stiffener subsequent part and the stiffener third part;
   a passive device electrically contacting the stiffener third part and the stiffener fourth part; and
   a passive device electrically contacting the stiffener fourth part and the stiffener first part.

9. The semiconductive apparatus of claim 1, wherein the stiffener further includes:
   a stiffener third part including an electrically conductive third adhesive that couples the stiffener third part to the semiconductor package substrate;
   a stiffener fourth part including an electrically conductive fourth adhesive that couples the stiffener fourth part to the semiconductor package substrate;
   a passive device electrically contacting the stiffener subsequent part and the stiffener third part;
   a passive device electrically contacting the stiffener third part and the stiffener fourth part;
   a passive device electrically contacting the stiffener fourth part and the stiffener first part; and
   a subsequent semiconductive device electrically coupled to the semiconductor package substrate die side, wherein the semiconductive device and the subsequent semiconductive device are disposed side-by-side on the semiconductor package die side.

10. The semiconductive apparatus of claim 1, wherein the stiffener further includes:
    a stiffener third part including an electrically conductive third adhesive that couples the stiffener third part to the semiconductor package substrate;
    a stiffener fourth part including an electrically conductive fourth adhesive that couples the stiffener fourth part to the semiconductor package substrate;
    a passive device electrically contacting the stiffener subsequent part and the stiffener third part;
    a passive device electrically contacting the stiffener third part and the stiffener fourth part;
    a passive device electrically contacting the stiffener fourth part and the stiffener first part; and
    a first stacked semiconductive device stacked on the semiconductive device, wherein the stiffener includes a first Z-direction profile, the stacked semiconductive device exhibits a second Z-direction profile, wherein the second profile is lower than the first profile.

11. The semiconductive apparatus of claim 1, wherein the semiconductive device includes:
    a first semiconductive device central processing unit electrically coupled to the semiconductor package substrate die side and electrically coupled through the semiconductive package substrate to at least one of the stiffener parts; and
    a supplemental semiconductive device platform controller hub electrically coupled to the semiconductor package substrate die side and electrically coupled through the semiconductive package substrate to at least one of the stiffener parts.

12. The semiconductive apparatus of claim 1, wherein the semiconductive device includes:
    a first semiconductive device and electrically coupled to the semiconductor package substrate die side and electrically coupled through the semiconductor package substrate to at least one of the stiffener parts; and
    a subsequent semiconductive device and electrically coupled to the semiconductor package substrate die side and electrically coupled through the semiconductor package substrate to at least one of the stiffener parts, and wherein the first and subsequent semiconductive devices are disposed side-by-side at an infield area of the semiconductor package substrate die side.

13. The semiconductive apparatus of claim 1, further including an external-frame stiffener that encompasses the stiffener first part and the stiffener subsequent part, wherein the external-frame stiffener is insulated from the several stiffener parts by an insulating adhesive.

14. A computing system, comprising:
a semiconductor package substrate including a die side and a land side;
a semiconductive device seated on the semiconductor package substrate die side;
a stiffener disposed on the die side, wherein the stiffener includes a stiffener first part and a stiffener subsequent part, wherein the stiffener first part is electrically coupled to the semiconductor package substrate by an electrically conductive first adhesive, wherein the stiffener subsequent part is electrically coupled to the semiconductor package substrate by an electrically conductive subsequent adhesive, and wherein one of the stiffener first part and stiffener subsequent part is coupled to power and the other of the stiffener first part and stiffener subsequent part is coupled to ground; and
a passive device electrically contacting the stiffener first part and the stiffener subsequent part by a solder layer; and
a shell coupled to a board, wherein the board is coupled to the semiconductor package substrate at the land side, wherein the semiconductive device is electrically coupled through the stiffener first part and stiffener subsequent part through the passive device, and wherein the shell electrically insulates the board.

15. The computing system of claim 14, further including:
a stiffener third part including an electrically conductive third adhesive that couples the stiffener third part to the semiconductor package substrate;
a stiffener fourth part including an electrically conductive fourth adhesive that couples the stiffener fourth part to the semiconductor package substrate;
a passive device electrically contacting the stiffener subsequent part and the stiffener third part;
a passive device electrically contacting the stiffener third part and the stiffener fourth part; and
a passive device electrically contacting the stiffener fourth part and the stiffener first part, and wherein the semiconductive device is a semiconductive first device, further including a semiconductive subsequent device seated on the semiconductor package substrate die side, side-by-side with the semiconductive first device.

* * * * *